(12) United States Patent
Uebel et al.

(10) Patent No.: US 11,237,486 B2
(45) Date of Patent: Feb. 1, 2022

(54) RADIATION SOURCE

(71) Applicant: ASML NETHERLANDS B.V., Veldhoven (NL)

(72) Inventors: Patrick Sebastian Uebel, Marloffstein (DE); Sebastian Thomas Bauerschmidt, Wendelstein (DE); Yongfeng Ni, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/932,184

(22) Filed: Jul. 17, 2020

(65) Prior Publication Data
US 2021/0026255 A1    Jan. 28, 2021

(30) Foreign Application Priority Data

Jul. 24, 2019 (EP) .................................... 19188036
Sep. 18, 2019 (EP) .................................... 19198105
Jan. 15, 2020 (EP) .................................... 20151889

(51) Int. Cl.
*G03F 7/20*    (2006.01)
*G02B 6/02*    (2006.01)
(Continued)

(52) U.S. Cl.
CPC ..... *G03F 7/70625* (2013.01); *G02B 6/02328* (2013.01); *G02F 1/3513* (2013.01);
(Continued)

(58) Field of Classification Search
CPC . G02B 6/02328; G02F 1/3513; G02F 1/3528; G02F 1/365; G03F 7/705;
(Continued)

(56) References Cited

U.S. PATENT DOCUMENTS 6,020,964 A    2/2000   Loopstra et al.
6,952,253 B2   10/2005   Lof et al.
(Continued)

FOREIGN PATENT DOCUMENTS

CN    102959465    3/2013
EP      1628164    2/2006
(Continued)

OTHER PUBLICATIONS

European Search Report issued in corresponding European Patent Application No. 19198105.9, dated Feb. 28, 2020.
(Continued)

*Primary Examiner* — Colin W Kreutzer
(74) *Attorney, Agent, or Firm* — Pillsbury Winthrop Shaw Pittman LLP

(57) ABSTRACT

A radiation source includes: a hollow core optical fiber, a working medium; and a pulsed pump radiation source. The hollow core optical fiber has a body and has a hollow core. The working medium is disposed within the hollow core. The pulsed pump radiation source is arranged to produce pulsed pump radiation that is received by, and propagates through, the hollow core from an input end to an output end. One or more parameters of the pulsed pump radiation, the optical fiber and the working medium are configured to allow soliton self-compression of the pulsed pump radiation so as to change a spectrum of the pulsed pump radiation so as to form output radiation. In some embodiments, a length of the optical fiber is such that the output end substantially coincides with a position at which a temporal extent of the pulsed pump radiation is minimal.

20 Claims, 8 Drawing Sheets

(51) Int. Cl.
*G02F 1/365* (2006.01)
*G02F 1/35* (2006.01)
*G03F 9/00* (2006.01)

(52) U.S. Cl.
CPC .............. *G02F 1/365* (2013.01); *G03F 7/705* (2013.01); *G03F 9/7065* (2013.01); *G02F 1/3528* (2021.01); *G03F 7/70633* (2013.01)

(58) Field of Classification Search
CPC .............. G03F 7/70616; G03F 7/70641; G03F 7/70625; G03F 7/70633; G03F 7/70775; G03F 9/7049; G03F 9/7065; G03F 9/7085
USPC .............. 355/67, 68, 77; 356/399–401, 614; 430/5, 30
See application file for complete search history.

(56) References Cited

U.S. PATENT DOCUMENTS

| | | |
|---|---|---|
| 6,961,116 B2 | 11/2005 | Den Boef et al. |
| 7,265,364 B2 | 9/2007 | Teunissen et al. |
| 7,646,471 B2 | 1/2010 | Teunissen et al. |
| 2005/0117157 A1 | 6/2005 | Tarsa |
| 2007/0058173 A1 | 3/2007 | Holzapfel |
| 2007/0296960 A1 | 12/2007 | Den Boef et al. |
| 2008/0198380 A1 | 8/2008 | Straaijer et al. |
| 2009/0168062 A1 | 7/2009 | Straaijer |
| 2009/0195768 A1 | 8/2009 | Bijnen et al. |
| 2010/0007863 A1 | 1/2010 | Jordanoska |
| 2010/0233600 A1 | 9/2010 | Den Boef et al. |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0002269 A1 | 1/2012 | Tempea |
| 2012/0044470 A1 | 2/2012 | Smilde et al. |
| 2012/0044495 A1 | 2/2012 | Straaijer |
| 2013/0162996 A1 | 6/2013 | Straaijer et al. |
| 2013/0308142 A1 | 11/2013 | Straaijer |
| 2014/0334763 A1* | 11/2014 | Holzer .................. H01S 3/0057 385/1 |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |
| 2018/0267235 A1* | 9/2018 | Russell .............. G02B 6/02328 |

FOREIGN PATENT DOCUMENTS

| | | |
|---|---|---|
| EP | 1417520 | 7/2007 |
| EP | 3136143 | 3/2017 |
| TW | 531670 | 5/2003 |
| TW | 200636229 | 10/2006 |
| WO | 2011012624 | 2/2011 |
| WO | 2016102127 | 6/2016 |

OTHER PUBLICATIONS

Adamu, Abubaker I., et al.: "Deep-UV to mid-IR supercontinuum generation driven by mid-IR ultrashort pulses in a gas-filled fiber", arXiv:1805.03118, May 8, 2018.

Welch, M.G., et al.: "Solitons in Hollow Core Photonic Crystal Fiber: Engineering Nonlinearity and Compressing Pulses", Journal of Lightware Technology, IEEE, vol. 27, No. 11, Jun. 1, 2009.

Travers, John C., et al.: "Ultrafast nonlinea optics in gas-filled hollow-core photonic crystal fibers", Journal of the Optical Society of America, vol. 28, No. 12, Dec. 1, 2011.

Russell, P. St. J., et al.: "Hollow-core photonic crystal fibres for gas-based nonlinear optics", Nature Photonics, vol. 8, Mar. 28, 2014.

Taiwanese Office Action issued in corresponding Taiwanese Patent Application No. 109124706, dated Feb. 19, 2021.

International Search Report and Written Opinion issued in corresponding PCT Patent Application No. PCT/EP2020/069760, dated Sep. 15, 2020.

Extended European Search Report issued in corresponding European Patent Application No. 20185490.8, dated Nov. 11, 2020.

* cited by examiner

RADIATION SOURCE

This application claims the benefit of priority of European patent application no. 19188036.8, filed Jul. 24, 2019, of European patent application no. 19198105.9, filed Sep. 18, 2019, and of European patent application no. 20151889.1, filed Jan. 15, 2020, each of the foregoing applications is incorporated herein in its entirety by reference.

FIELD

The present description relates to a radiation source. The radiation source may be a supercontinuum source and may comprise an apparatus for receiving input radiation and broadening a frequency range of the input radiation so as to provide (broadband) output radiation.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

In the field of lithography, many measurement systems may be used, both within a lithographic apparatus and external to a lithographic apparatus. Generally, such a measurements system may use a radiation source to irradiate a target with radiation, and a detection system operable to measure at least one property of a portion of the incident radiation that scatters from the target. An example of a measurement system that is external to a lithographic apparatus is an inspection apparatus or a metrology apparatus, which may be used to determine one or more properties of a pattern previously projected onto a substrate by the lithographic apparatus. Such an external inspection apparatus may, for example, comprise a scatterometer. Examples of measurement systems that may be provided within a lithographic apparatus include: a topography measurement system (also known as a level sensor); a position measurement system (for example an interferometric device) for determining position of a reticle or wafer stage; and/or an alignment sensor for determining a position of an alignment mark. These measurement devices may use electromagnetic radiation to perform the measurement.

SUMMARY

Different types of radiation may be used to interrogate different types of properties of a pattern. Some measurements system may use a broadband radiation source. Such a broadband radiation source may be a supercontinuum source and may comprise an optical fiber having a non-linear medium through which a pulsed pump radiation beam is propagated to broaden a spectrum of the radiation.

It may be desirable to provide alternative apparatus and methods for use in an apparatus for receiving input radiation and broadening a frequency range of the input radiation so as to provide (broadband) output radiation that at least partially addresses one or more problems associated with the prior art whether identified herein or otherwise.

According to an aspect, there is provided a radiation source comprising: a hollow core optical fiber comprising a body having a hollow core; a working medium disposed within the hollow core; and a pulsed pump radiation source arranged to produce pulsed pump radiation that is received by, and propagates through, the hollow core from an input end to an output end, wherein parameters of the pulsed pump radiation, the optical fiber and the working medium are configured to allow soliton self-compression of the pulsed pump radiation so as to change a spectrum of the pulsed pump radiation so as to form output radiation, and wherein a length of the optical fiber is such that the output end substantially coincides with a position at which a temporal extent of the output radiation is minimal.

According to an aspect, there is provided a radiation source comprising: a hollow core optical fiber comprising a body having a hollow core; a working medium disposed within the hollow core; and a pulsed pump radiation source arranged to produce pulsed pump radiation that is received by, and propagates through, the hollow core from an input end to an output end, wherein parameters of the pulsed pump radiation, the optical fiber and the working medium are configured to allow soliton self-compression of the pulsed pump radiation so as to change a spectrum of the pulsed pump radiation so as to form output radiation, and wherein a length of the optical fiber is such that the output end substantially coincides with a position at which a breadth of the spectrum of the output radiation is maximal.

The radiation sources are advantageous, for example, since they allow a broadband output radiation beam to be produced at the output end. This may be useful for use within metrology apparatus, for example within a lithographic apparatus.

Some broadband radiation sources use arrangements which produce spectral broadening of pulsed pump radiation but wherein parameters of the pulsed pump radiation, the optical fiber and the working medium are configured to allow modulational instability to produce the spectral broadening. There are a number of reasons why modulational instability is used to produce the spectral broadening. First, modulational instability is known to produce broadband radiation having a relatively flat intensity-wavelength distribution. Such a broadband radiation source may be referred to as a white light radiation source (due to the relatively flat spectral intensity distribution). Second, modulational instability can be achieved using relatively economical laser sources as the pump radiation source.

On the other hand, soliton self-compression is a regime that is used for generating, from an input pump laser beam, one or more output laser beams having a shifted wavelength. For example, soliton self-compression is used for generating a dispersive wave having a different (shifted) wavelength. In a soliton self-compression regime (with a relatively low soliton number) a pulse of radiation can undergo significant temporal compression, which is accompanied by spectral broadening. Eventually, the temporal compression will reach a maximal level (corresponding to a minimum temporal extent of the pulsed radiation) followed by temporal broadening of the radiation. This temporal broadening is referred to as soliton fission as the higher order soliton splits into a plurality of individual solitons. The (higher order) soliton may oscillate between periods of temporal compression and temporal broadening as it propagates along the hollow core optical fiber. Following temporal broadening, other effects can lead to shifting of the spectrum of the radiation. For example, self-steepening (which may accompany and aid the soliton self-compression) can lead to an optical shock which can seed dispersive wave emission. By tuning parameters of the system, a particular, desirable wavelength may be generated. For example, the wavelength may be selected so as to be suitable for interacting with a particular molecule and used in research experiments studying the molecule. Therefore, soliton self-compression is a regime for generating from an input pump laser beam having first wavelength, an output radiation beam having a second, shifted wavelength.

It has been realized that during soliton self-compression, before the temporal broadening (and before any dispersive waves are formed), there is a (short-lived) transition period during which the radiation propagating through the hollow-core fiber is broadband radiation. Furthermore, it has been realized that, although this broadband radiation is short lived, by selecting the length of the optical fiber such that the output end substantially coincides with a position at which the soliton self-compression has occurred but before subsequent temporal broadening (soliton fission) and shifting of the spectrum, this broadband radiation can be output from the optical fiber so as to provide a particularly stable broadband radiation source.

In particular, a particularly stable broadband radiation source can be provided if the length of the optical fiber is such that the output end substantially coincides with a position at which a temporal extent of the pulsed pump radiation is minimal. It will be appreciated that as used herein the output end will substantially coincide with a position at which a temporal extent of the pulsed pump radiation is minimal if the temporal extent of the pulsed pump radiation at the output end is the smallest that it has been within the optical fiber. That is, the output end will substantially coincide with a position at which a temporal extent of the pulsed pump radiation is minimal if the temporal extent of the pulsed pump radiation has not yet increased (due to soliton fission). It will be appreciated that, for a sufficiently long hollow core optical fiber, as radiation propagates through the hollow core fiber the soliton may oscillate between periods of temporal compression and temporal broadening. In between each period of temporal compression and temporal broadening there may be a local minimum in the temporal extent of the pulsed pump radiation. The output end will substantially coincide with a position at which a temporal extent of the pulsed pump radiation is minimal if the length of the hollow core optical fiber is such that the output end is positioned anywhere up to or including the first local minimum. Greatest spectral broadening may be achieved if the output end substantially coincides with the first local minimum.

Generally, after the soliton self-compression the breadth of the spectrum of the pulsed pump radiation may decrease and/or gaps in the spectrum may develop (for example as dispersive waves are emitted). Therefore, a particularly stable broadband radiation source can be provided if the length of the optical fiber is such that the output end substantially coincides with a position at which a breadth of the spectrum of the pulsed pump radiation is maximal. It will be appreciated that as used here, the breadth of the spectrum of the pulsed pump radiation (which may alternatively be referred to as the spectral bandwidth of the pulsed pump radiation) may be the width of the spectrum for which a power density is above a threshold fraction of the maximum. For example, the breadth of the spectrum of the pulsed pump radiation may be the width of the spectrum for which a power density is above 0.0001 of the maximum (i.e. a spectrum that spans 40 decibels). For example, the breadth of the spectrum of the pulsed pump radiation may be the width of the spectrum for which a power density is above 0.001 of the maximum (i.e. a spectrum that spans 30 decibels). For example, the breadth of the spectrum of the pulsed pump radiation may be the width of the spectrum for which a power density is above 0.01 of the maximum (i.e. a spectrum that spans 20 decibels). For example, the breadth of the spectrum of the pulsed pump radiation may be the width of the spectrum for which a power density is above 0.1 of the maximum (i.e. a spectrum that spans 10 decibels). Alternatively, a particularly stable broadband radiation source can be provided if the length of the optical fiber is such that the output end substantially coincides with a position at which the spectrum of the output radiation is substantially continuous.

In contrast to chaotic-driven modulational instability systems, broadband radiation generated by such soliton self-compression will have no shot-to-shot variations. As a result, advantageously, a stable output spectrum can be generated using a single pulse (in contrast to several pulses that would be required to produce some stability in the output beam of a modulational instability system).

It will be appreciated that, as the radiation propagates through the hollow core fiber, the soliton may oscillate between periods of temporal compression and temporal broadening. In between each period of temporal compression and temporal broadening there may be a local minimum in the temporal extent of the pulsed pump radiation. In principle, the length of the optical fiber may be such that the output end substantially coincides with any such position of minimal temporal extent of the pulsed pump radiation. However, the most stable output spectrum (for example against pulse to pulse variations) may be provided by when the output end coincides with the first position of minimal temporal extent of the pulsed pump radiation.

The length of the optical fiber may be such that the output end substantially coincides with a first local minimum of a temporal extent of the pulsed pump radiation. It will be appreciated that the position of the first local minimum of a temporal extent of the pulsed pump radiation may be dependent on a number of factors including, for example, the parameters of the fiber (for example a core diameter and a length of the fiber), the working medium (for example type of gas and pressure) and the pulsed pump radiation (for example pulse energy and pulse duration). In order for the output end to substantially coincide with the first local minimum of a temporal extent of the pulsed pump radiation, the output end may be disposed sufficiently close to the first local minimum of a temporal extent of the pulsed pump radiation such that the compressed pulse has not yet expanded or dispersed by 200% of the first local minimum of a temporal extent of the pulsed pump radiation. For example, the output end may be disposed sufficiently close to the first local minimum of a temporal extent of the pulsed pump radiation such that the compressed pulse has not yet expanded or dispersed by 100% of the first local minimum of a temporal extent of the pulsed pump radiation. For example, the output end may be disposed sufficiently close to the first local minimum of a temporal extent of the pulsed pump radiation such that the compressed pulse has not yet expanded or dispersed by 50% of the first local minimum of a temporal extent of the pulsed pump radiation. For example, the output end may be disposed sufficiently close to the first local minimum of a temporal extent of the pulsed pump radiation such that the compressed pulse has not yet expanded or dispersed by 10% of the first local minimum of a temporal extent of the pulsed pump radiation. For example, the output end may be disposed sufficiently close to the first local minimum of a temporal extent of the pulsed pump radiation such that the compressed pulse has not yet expanded or dispersed by 5% of the first local minimum of a temporal extent of the pulsed pump radiation.

A pulse duration of the input pulsed pump radiation may be greater than 50 fs. For example, the pulse duration of the input pulsed pump radiation may be greater than 100 fs, for example of the order of 150 fs.

A pulse energy of the input pulsed pump radiation may be less than 1 µJ. For example, the pulse energy of the input pulsed pump radiation may be less than 0.75 µJ. For example, the pulse energy of the input pulsed pump radiation may be less than 0.5 µJ, for example of the order of 0.4 µJ.

The input pulsed pump radiation may have any desired wavelength. In some embodiments, the input pulsed pump radiation may have a wavelength of around 1 µm.

According to an aspect, there is provided a radiation source comprising: a hollow core optical fiber comprising a body having a hollow core; a working medium disposed within the hollow core; and a pulsed pump radiation source arranged to produce pulsed pump radiation that is received by, and propagates through, the hollow core from an input end to an output end, wherein parameters of the pulsed pump radiation, the optical fiber and the working medium are configured to allow soliton self-compression of the pulsed pump radiation so as to change a spectrum of the pulsed pump radiation, and wherein a pulse duration of the input pulsed pump radiation is greater than 50 fs.

For example, the pulse duration of the input pulsed pump radiation may be greater than 100 fs, for example of the order of 150 fs.

According to an aspect, there is provided a radiation source comprising: a hollow core optical fiber comprising a body having a hollow core; a working medium disposed within the hollow core; and a pulsed pump radiation source arranged to produce pulsed pump radiation that is received by, and propagates through, the hollow core from an input end to an output end, wherein parameters of the pulsed pump radiation, the optical fiber and the working medium are configured to allow soliton self-compression of the pulsed pump radiation so as to change a spectrum of the pulsed pump radiation, and wherein a pulse energy of the input pulsed pump radiation is less than 1 µJ.

For example, the pulse energy of the input pulsed pump radiation may be less than 0.75 µJ. For example, the pulse energy of the input pulsed pump radiation may be less than 0.5 µJ, for example of the order of 0.4 µJ.

The radiation sources are advantageous, for example, since they allow a broadband output radiation beam to be produced at the output end. This may be useful for use within metrology apparatus, for example within a lithographic apparatus.

The radiation sources are, for example, more stable, for example against pulse to pulse variations, than broadband radiation sources which produce spectral broadening of pulsed pump radiation under a modulational instability regime.

The soliton order N of the input pulsed pump radiation is a convenient parameter that can be used to distinguish conditions under which spectral broadening is dominated by modulational instability and conditions under which spectral broadening is dominated by soliton self-compression. Spectral broadening is typically dominated by modulational instability when $N \gg 20$ whereas spectral broadening is typically dominated by soliton self-compression when $N \ll 20$.

Therefore, for arrangements which use soliton self-compression it is desirable to produce input pulsed pump radiation with a low soliton order N. Furthermore, the soliton order of the input pulsed pump radiation is proportional to the pulse duration of the input pulsed pump radiation. Therefore, generally arrangements wherein soliton self-compression dominates, typically the pulse duration of the input pulsed pump radiation is reduced to of the order of 30 fs or less. To realize such an arrangement, typically a high-power femtosecond-fiber lasers or Ti:Sapph amplifiers are used as the pulsed pump radiation source. The laser heads are relatively bulky (a femtosecond-fiber laser head has, for example, dimensions of 60×40×20 cm) and, in most cases, require external controllers and water chillers. In addition, such lasers are relatively cost intensive.

It has been realized that the soliton order of the input pulsed pump radiation can alternatively be reduced by reducing the pulse energy of the input pulsed pump radiation. For example, if all other parameters remain constant, by reducing the pulse energy of the input pulsed pump radiation by a factor of a, the same soliton order can be achieved using a pulse duration that is increased by a factor of a. This reduction of the pulse energy is contrary to the teachings of the prior art wherein it is taught to use increased pulse energy. In the art, radiation sources using soliton self-compression are typically used for research applications such as, for example atomic or molecular spectroscopy wherein it is desirable to maximize the pulse energy of the radiation source.

In an aspect, a soliton order of the input pulsed pump radiation may be less than 20.

In an aspect, the working medium may be configured to produce anomalous dispersion. That is, the working medium may have a negative group delay dispersion parameter.

In an aspect, the hollow core optical fiber may comprise a cladding portion surrounding the hollow core, and the cladding portion may comprise a plurality of anti-resonance elements for guiding radiation through the hollow core. Each of the plurality of anti-resonance elements may comprise a capillary.

The plurality of anti-resonance elements of the cladding portion may be disposed in a ring structure around the hollow core.

The plurality of anti-resonance elements may be arranged so that each of the anti-resonance elements is not in contact with any of the other anti-resonance elements.

In an aspect, the working medium may comprise a noble gas. For example, the working medium may comprise one or more selected from: argon, krypton, neon, helium and/or xenon.

In an aspect, the working medium may comprise a molecular gas. For example, the working medium may comprise one or more selected from: $N_2$, $O_2$, $CH_4$ and/or $SF_6$.

According to an aspect, there is provided a metrology arrangement for determining a parameter of interest of a structure on a substrate, the metrology arrangement comprising: a radiation source as described herein; an illumination sub-system for illuminating the structure on the substrate using the broadband output radiation; and a detection sub-system for detecting a portion of radiation scattered and/or reflected by the structure, and for determining the parameter of interest from said portion of radiation.

According to an aspect, there is provided a lithographic apparatus comprising a metrology arrangement as described herein.

According to an aspect, there is provided a method of selecting an operating regime of a radiation source, the radiation source comprising: a hollow core optical fiber comprising a body having a hollow core; a working medium disposed within the hollow core; and a pulsed pump radiation source arranged to produce pulsed pump radiation that is received by, and propagates through, the hollow core from an input end to an output end, wherein the method comprises: selecting one or more parameters of one or more selected from: the pulsed pump radiation, the optical fiber and/or the working medium so as to allow soliton self-compression of the pulsed pump radiation so as to change a spectrum of the pulsed pump radiation so as to form output radiation, and further wherein the one or more parameters are selected such that a length of the optical fiber is such that the output end substantially coincides with a position at which: a temporal extent of the output radiation is minimal, and/or a breadth of the spectrum of the output radiation is maximal.

The method provides a method by which a radiation source as described herein can be designed.

In an initial application of the method, one or more parameters of the optical fiber may be selected. Once the optical fiber has been manufactured, its one or more parameters may be determined, for example by measurement, and can be input as constraints into a second application of the method.

One or more parameters of the optical fiber may be fixed and one or more parameters of the pulsed pump radiation and/or the working medium may be selected. This may allow the one or more working parameters of the pulsed pump radiation and/or the working medium to be selected when one or more parameters of the optical fiber are fixed (for example, once the optical fiber has been manufactured).

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
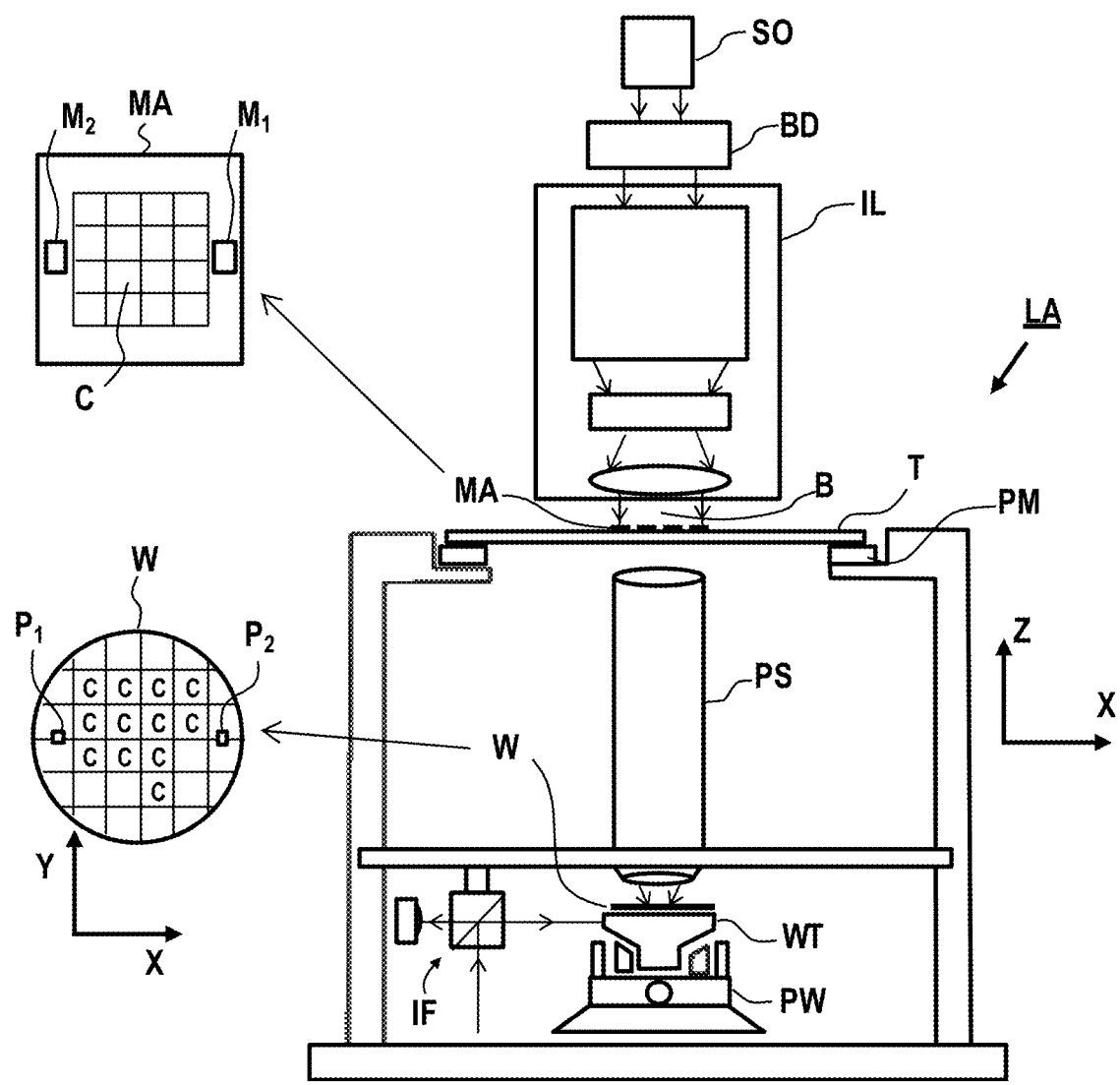
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
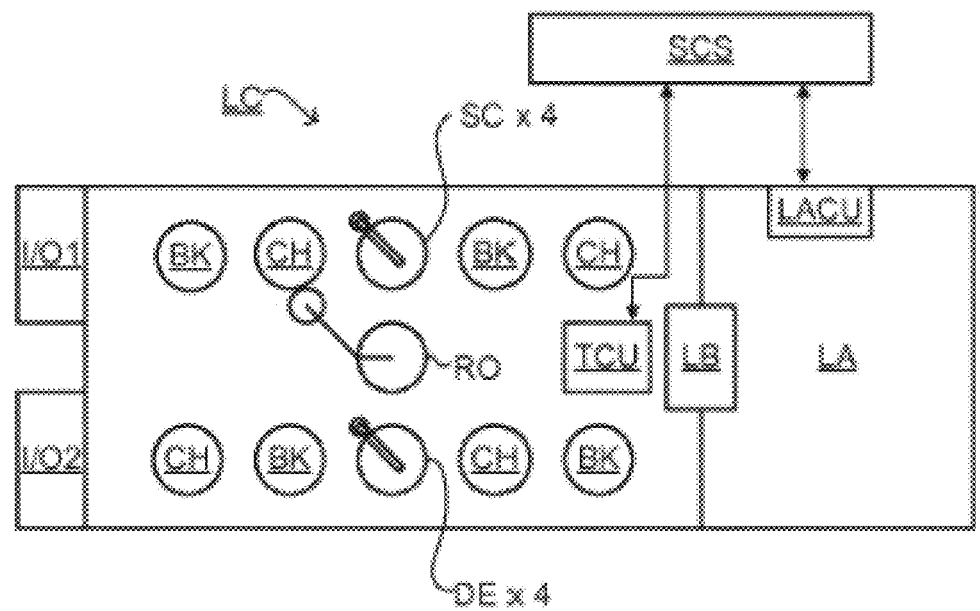
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
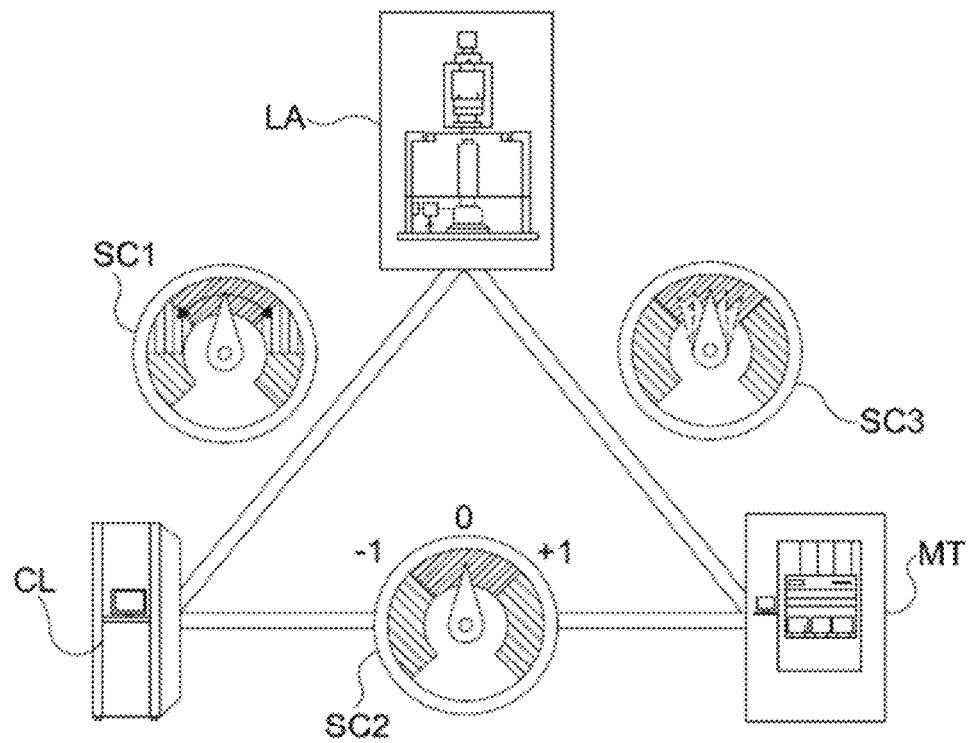
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3). Different types of metrology tools MT for measuring one or more properties relating to a lithographic apparatus and/or a substrate to be patterned will now be described.

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. Patent Application Publication Nos. US20100328655, US2011102753A1, US20120044470A, US20110249244, US20110026032 and in European Patent Application Publication No. EP1,628,164A, each of the foregoing patent documents incorporated herein by reference. Aforementioned scatterometers may measure gratings using radiation from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization state. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. Patent Application Publication Nos. 2007-0296960, 2008-0198380, 2009-0168062, 2010-0007863, 2011-0032500, 2011-0102793, 2011-0188020, 2012-0044495, 2013-0162996 and 2013-0308142, each of which is incorporated herein in its entirety by reference.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in European Patent Application Publication No. EP1,628,164, which is incorporated herein in its entirety by reference, such that any asymmetry is clearly distinguishable. This provides a straightforward way to measure misalignment in gratings. Further examples for measuring overlay error between the two layers containing periodic structures as target is measured through asymmetry of the periodic structures may be found in PCT Patent Application Publication No. WO 2011/012624 and U.S. Patent Application No. US 20160161863, each of which is incorporated herein in its entirety by reference.

Other parameters of interest may be focus and dose. Focus and dose may be determined simultaneously by scatterometry (or alternatively by scanning electron microscopy) as described in U.S. Patent Application Publication No. US2011-0249244, incorporated herein in its entirety by reference. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. Patent Application Publication Nos. US 2016-0161863 and US 2016-0370717, each of which is incorporated herein its entirety by reference.

Figure 4:
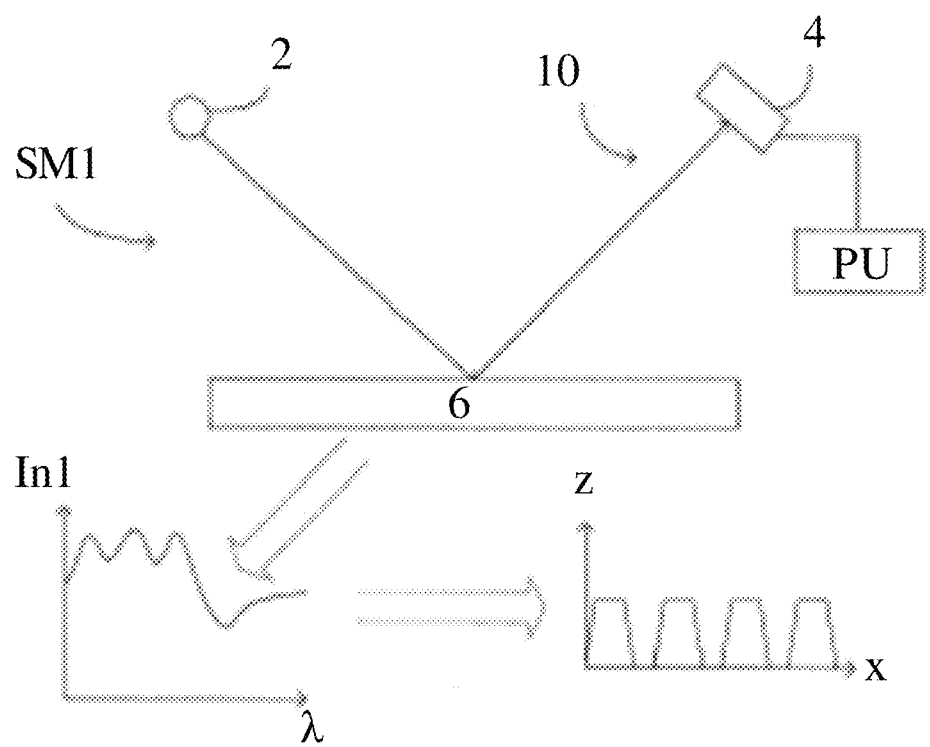
FIG. 4 depicts a schematic overview of a scatterometer metrology tool.

A metrology apparatus, such as a scatterometer SM1, is depicted in FIG. 4. It comprises a broadband (e.g., white light) radiation projector 2 which projects radiation onto a substrate 6. The reflected or scattered radiation is passed to a spectrometer detector 4, which measures a spectrum 10 (i.e. a measurement of intensity In1 as a function of wavelength A) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. Patent Application Publication Nos. US 2010-0328655, US 2011-102753, US 2012-0044470, US 2011-0249244, and US 2011-0026032 and in European Patent Application Publication No. EP1,628,164A, each of which is incorporated herein in its entirety reference. Aforementioned scatterometers can measure in one image multiple targets from multiple gratings using radiation from soft x-ray and visible to near-IR wave range.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
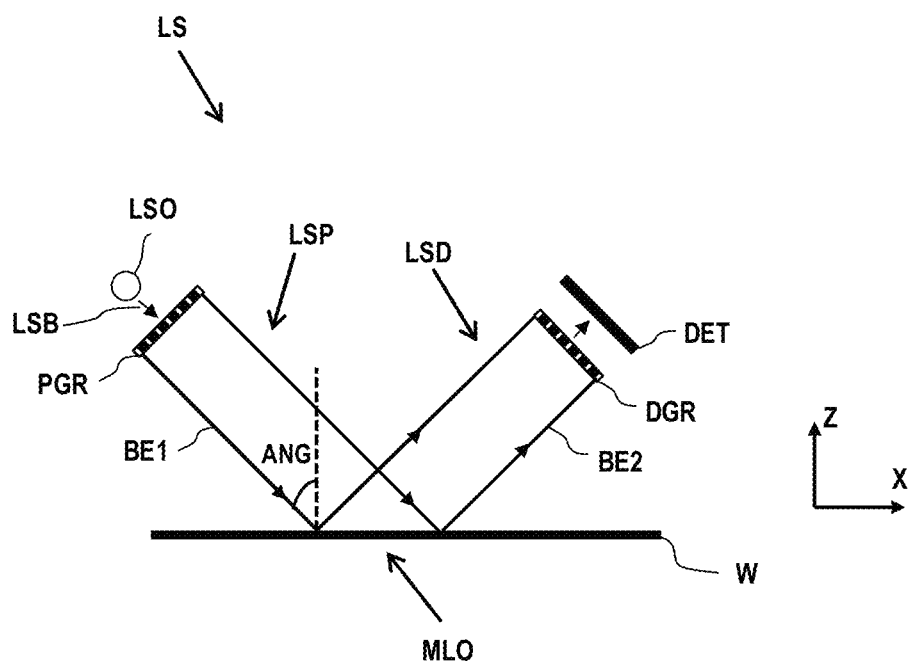
FIG. 5 depicts a schematic overview of a level sensor metrology tool.

An example of a level or height sensor LS is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum radiation source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed as radiation BE2 towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the radiation received, for example indicative of the intensity of the radiation received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, among other things, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. U.S. Pat. Nos. 7,265,364 and 7,646,471, each of which is incorporated herein in its entirety by reference. A height sensor using UV radiation instead of visible or infrared radiation is disclosed in U.S. Patent Application Publication No. US2010233600A1, which is incorporated herein in its entirety by reference. In PCT Patent Application Publication No. WO 2016102127A1, which is incorporated herein in its entirety by reference, a compact height sensor is described which uses a multi-element detector to detect and recognize the position of a grating image, without needing a detection grating.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States Patent Application Publication No. US 2007/0058173, which is incorporated herein in its entirety by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. The primary radiation beam and/or the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $\pm 2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. Either of the encoder head or the grating may be arranged on the substrate structure WT. The other of the encoder head or the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, which is hereby incorporated in its entirety by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

In the manufacture of complex devices, typically many lithographic patterning steps are performed, thereby forming functional features in successive layers on the substrate. A significant aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks". A mark may also be referred to as a metrology target.

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor for use in a lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. Patent Application Publication No. US 20150261097, which is incorporated herein in its entirety by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in U.S. Patent Application Publication No. US2009/195768A, which is incorporated herein in its entirety by reference.

The alignment sensor scans each mark optically with a spot of radiation to obtain a periodically varying signal, such as a sine wave. The phase of this signal is analyzed to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 6:
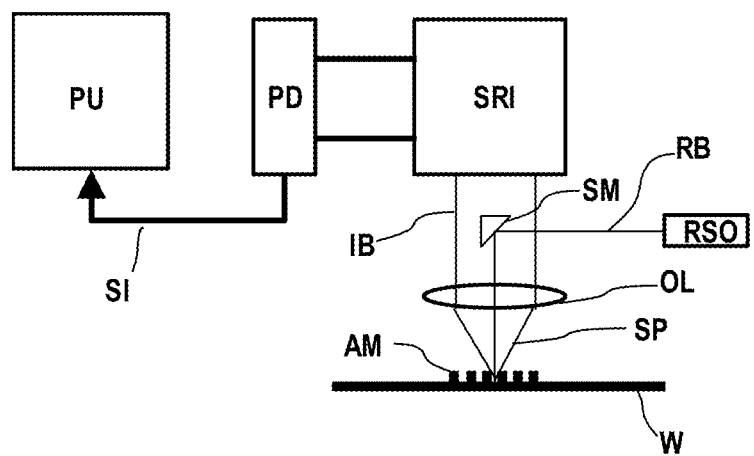
FIG. 6 depicts a schematic overview of an alignment sensor metrology tool.

FIG. 6 is a schematic block diagram of an embodiment of an alignment sensor AS. An embodiment of such an alignment is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in width than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Metrology tools MT, such as a scatterometer, topography measurement system, or position measurement system mentioned above may use radiation originating from a radiation source to perform a measurement. One or more properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, as discussed further below with reference to FIG. 8, one or more methods and apparatuses for broadening input radiation may use a fiber for confining input radiation, and for broadening the input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensity. The hollow core of the fiber may be filled with a gas acting as a broadening medium for broadening input radiation. Such a fiber and gas arrangement may be used to create a supercontinuum radiation source. Radiation input to the fiber may be electromagnetic radiation, for example radiation in one or more of the infrared, visible, UV, and extreme UV spectra. The output radiation may consist of or comprise broadband radiation. Such broadband radiation may be referred to herein as "white light".

Some embodiments relate to a new design of such a broadband radiation source comprising an optical fiber. In an embodiment, the optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known as anti-resonant fibers, tubular fibers, single-ring fibers, negative curvature fibers or inhibited coupling fibers. Various different designs of such fibers are known. Alternatively, the optical fiber may be a photonic bandgap fiber (for example a Kagome fiber).

Figure 7:
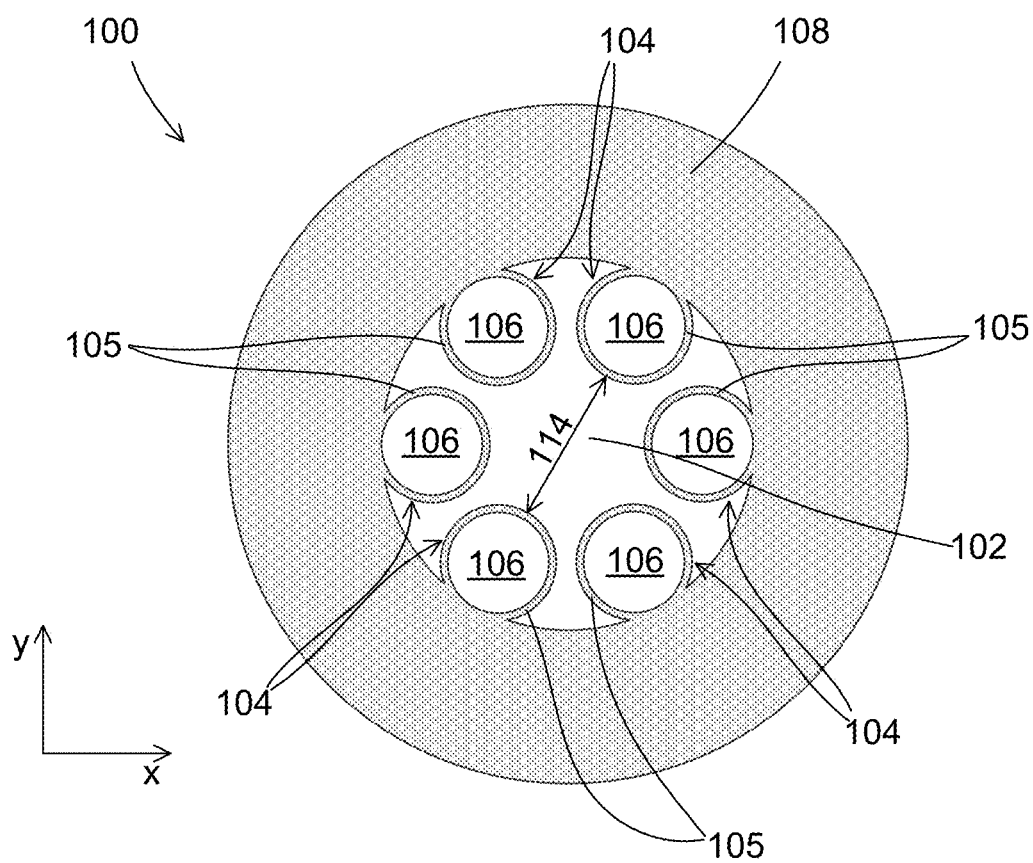
FIG. 7 is a schematic cross sectional view of a hollow core optical fiber that may form part of a radiation source according to an embodiment in a transverse plane (i.e. perpendicular to an axis of the optical fiber)

An example of an optical fiber for use in the radiation source is now described with reference to FIG. 7, which is a schematic cross sectional view of the optical fiber 100 in a transverse plane.

The optical fiber 100 comprises an elongate body, which is longer in one dimension compared to the other two dimensions of the fiber 100. This longer dimension may be referred to as an axial direction and may define an axis of the optical fiber 100. The two other dimensions define a plane which may be referred to as a transverse plane. FIG. 7 shows a cross-section of the optical fiber 100 in this transverse plane (i.e. perpendicular to the axis), which is labelled as the x-y plane. The transverse cross-section of the optical fiber 100 may be substantially constant along the fiber axis.

It will be appreciated that the optical fiber 100 has some degree of flexibility and therefore the direction of the axis will not, in general, be uniform along the length of the optical fiber 100. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber 100 is flexed.

The optical fiber 100 may have any length and it will be appreciated that the length of the optical fiber 100 may be dependent on the application. The optical fiber 100 may have a length between 1 cm and 20 m, for example, the optical fiber 100 may have a length between 1 cm and 10 m, or for example, the optical fiber 100 may have a length between 10 cm and 100 cm.

The optical fiber 100 comprises: a hollow core 102; a cladding portion surrounding the hollow core 102; and a support portion 108 surrounding and supporting the cladding portion. The optical fiber 100 may be considered to comprise a body (comprising the cladding portion and the support portion 108) having a hollow core 102. The cladding portion comprises a plurality of anti-resonance elements for guiding radiation through the hollow core 102. In particular, the plurality of anti-resonance elements are arranged to confine radiation that propagates through the optical fiber 100 predominantly inside the hollow core 102 and to guide the radiation along the optical fiber 100. The hollow core 102 of the optical fiber 100 may be disposed substantially in a central region of the optical fiber 100, so that the axis of the optical fiber 100 may also define an axis of the hollow core 102 of the optical fiber 100.

In an embodiment, the cladding portion comprises a plurality of anti-resonance elements for guiding radiation propagating through the optical fiber 100. In particular, in this embodiment, the cladding portion comprises a single ring of six tubular capillaries 104. Each of the tubular capillaries 104 acts as an anti-resonance element.

The capillaries 104 may also be referred to as tubes. The capillaries 104 may be circular in cross section, or may have another shape. Each capillary 104 comprises a generally cylindrical wall portion 105 that at least partially defines the hollow core 102 of the optical fiber 100 and separates the hollow core 102 from a capillary cavity 106. It will be appreciated that the wall portion 105 may act as an anti-reflecting Fabry-Perot resonator for radiation that propagates through the hollow core 102 (and which may be incident on the wall portion 105 at a grazing incidence angle). The thickness of the wall portion 105 may be suitable so as to help ensure that reflection back into the hollow core 102 is generally enhanced whereas transmission into the capillary cavity 106 is generally suppressed. In some embodiments, the capillary wall portion 105 may have a thickness between 0.01-10.0 μm.

It will be appreciated that, as used herein, the term cladding portion is intended to mean a portion of the optical fiber 100 for guiding radiation propagating through the optical fiber 100 (i.e. the capillaries 104 which confine the radiation within the hollow core 102). The radiation may be confined in the form of transverse modes, propagating along the fiber axis.

The support portion is generally tubular and supports the capillaries 104 of the cladding portion. The capillaries 104 are distributed evenly around an inner surface if the inner support portion 108. In an embodiment, the capillaries 104 may be described as being disposed in a generally hexagonal formation.

The capillaries 104 are arranged so that each capillary is not in contact with any of the other capillaries 104. Each of the capillaries 104 is in contact with the inner support portion 108 and spaced apart from adjacent capillaries 104 in the ring structure. Such an arrangement may be beneficial since it may increase a transmission bandwidth of the optical fiber 100 (relative, for example, to an arrangement wherein the capillaries are in contact with each other). Alternatively, in some embodiments, one or more of the capillaries 104 may be in contact with one or more adjacent capillaries 104 in the ring structure.

The capillaries 104 of the cladding portion are disposed in a ring structure around the hollow core 102. An inner surface of the ring structure of capillaries 104 at least partially defines the hollow core 102 of the optical fiber 100. The width (e.g., diameter) of the hollow core 102 (which may be defined as the smallest dimension between opposed capillaries, indicated by arrow 114) may be between 10 and 1000 μm. The width 114 of the hollow core 102 may affect the mode field width/diameter, impact loss, dispersion, modal plurality, and non-linearity properties of the hollow core optical fiber 100.

In this embodiment, the cladding portion comprises a single ring arrangement of capillaries 104 (which act as anti-resonance elements). Therefore, a line in any radial direction from a center of the hollow core 102 to an exterior of the optical fiber 100 passes through no more than one capillary 104.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 7 comprises a ring of six capillaries, in other embodiments, one or more rings comprising any number of anti-resonance elements (for example 4, 5, 6, 7, 8, 9, 10, 11 or 12 capillaries) may be provided in the cladding portion. Optionally, the support portion 108 may comprise a deformable portion to at least partially isolate the cladding portion from external stresses.

Figure 8:
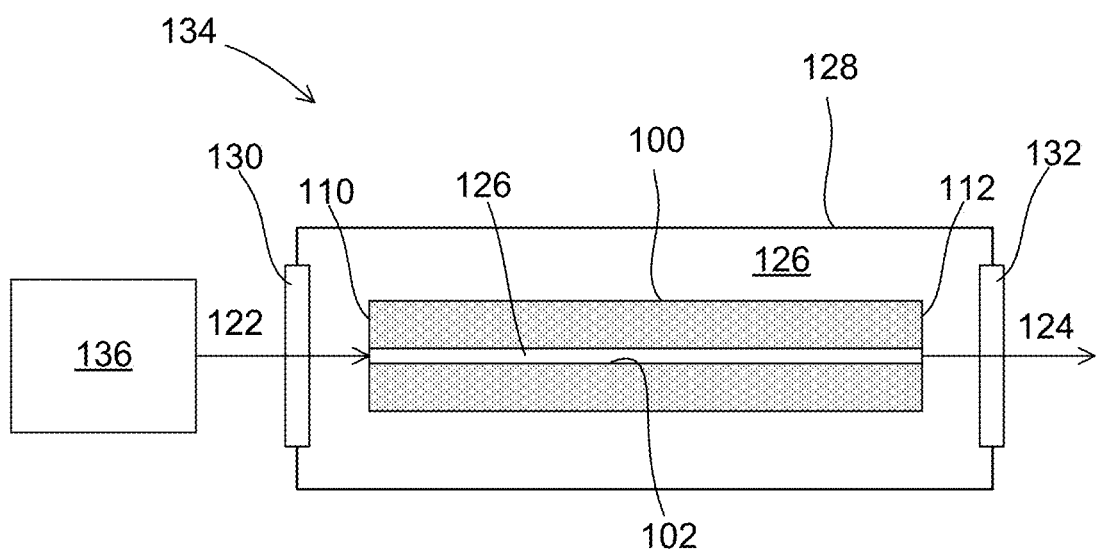
FIG. 8 depicts a schematic representation of a radiation source according to an embodiment for providing broadband output radiation.

FIG. 8 depicts an embodiment of a radiation source 134 for providing broadband output radiation. The radiation source 134 comprises a pulsed pump radiation source 136; an optical fiber 100 (of the type shown in FIG. 7) with a hollow core 102; and a working medium 126 (for example a gas) disposed within the hollow core 102. Although in FIG. 8 the radiation source 134 comprises the optical fiber 100 shown in FIG. 7, in alternative embodiments other types of hollow core optical fiber may be used.

The pulsed pump radiation source 136 is configured to provide input radiation 122. The hollow core 102 of the optical fiber 100 is arranged to receive the input radiation 122 from the pulsed pump radiation source 136, and broaden it to provide output radiation 124. The working medium 126 enables the broadening of the frequency range of the received input radiation 122 so as to provide broadband output radiation 124.

The radiation source 134 further comprises a reservoir 128. The optical fiber 100 is disposed inside the reservoir 128. The reservoir 128 may also be referred to as a housing or container. The reservoir 128 is configured to contain the working medium 126. The reservoir 128 may comprise one or more features, known in the art, for controlling, regulating, and/or monitoring the composition of the working medium 126 (which may be a gas) inside the reservoir 128. The reservoir 128 may comprise a first transparent window 130. In use, the optical fiber 100 is disposed inside the reservoir 128 such that the first transparent window 130 is located proximate to an input end 110 of the optical fiber 100. The first transparent window 130 may form part of a wall of the reservoir 128. The first transparent window 130 may be transparent for at least the received one or more input radiation frequencies, so that received input radiation 122 (or at least a large portion thereof) may be coupled into the optical fiber 100 located inside reservoir 128. It will be appreciated that optics (not shown) may be provided for coupling the input radiation 122 into the optical fiber 100.

The reservoir 128 comprises a second transparent window 132, forming part of a wall of the reservoir 128. In use, when the optical fiber 100 is disposed inside the reservoir 128, the second transparent window 132 is located proximate to an output end 112 of the optical fiber 100. The second transparent window 132 may be transparent for at least the frequencies of the broadband output radiation 124 of the apparatus 120.

In an embodiment, the two opposed ends of the optical fiber 100 may be placed inside different reservoirs. The optical fiber 100 may comprise a first end section configured to receive input radiation 122, and a second end section for outputting broadband output radiation 124. The first end section may be placed inside a first reservoir, comprising a working medium 126. The second end section may be placed inside a second reservoir, wherein the second reservoir may also comprise a working medium 126. The functioning of the reservoirs may be as described in relation to FIG. 8 above. The first reservoir may comprise a first transparent window, configured to be transparent for input radiation 122. The second reservoir may comprise a second transparent window configured to be transparent for broadband output broadband radiation 124. The first and second reservoirs may also comprise a sealable opening to permit the optical fiber 100 to be placed partially inside and partially outside the reservoir, so that a gas can be sealed inside the reservoir. The optical fiber 100 may further comprise a middle section not contained inside a reservoir. Such an arrangement using two separate gas reservoirs may be particularly convenient for embodiments wherein the optical fiber 100 is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium 126 within the hollow core 102 of the optical fiber 100.

In this context a window may be transparent for a frequency if at least 50%, 75%, 85%, 90%, 95%, or 99% of incident radiation of that frequency on the window is transmitted through the window.

Both the first 130 and the second 132 transparent windows may form a gastight seal within the walls of the reservoir 128 so that the working medium 126 (which may be a gas) may be contained within the reservoir 128. It will be appreciated that the gas 126 may be contained within the reservoir 128 at a pressure different to the ambient pressure of the reservoir 128.

The working medium 126 may comprise a noble gas. The working medium 126 may comprise one or more selected from: argon, krypton, neon, helium and/or xenon. Alternatively or additionally to the noble gas, the working component may comprise a molecular gas (e.g. $H_2$, $N_2$, $O_2$, $CH_4$, $SF_6$). The working medium 126 may also comprise mixtures of two or more selected from: argon, krypton, neon, helium, xenon and/or a molecular gas (e.g. $H_2$, $N_2$, $O_2$, $CH_4$, $SF_6$). The working medium 126 may be configured to produce anomalous dispersion, and, optionally, to produce anomalous dispersion at a wavelength of the input radiation 122. That is, the working medium 126 may have a negative group delay dispersion parameter.

In one implementation, the working medium 126 may be disposed within the hollow core 102 at least during receipt of input radiation 122 for producing broadband output radiation 124. It will be appreciated that, while the optical fiber 100 is not receiving input radiation 122 for producing broadband output radiation, the gas 126 may be wholly or partially absent from the hollow core 102.

In order to achieve frequency broadening, high intensity radiation may be desirable. An advantage of having a hollow core optical fiber 100 is that it may achieve high intensity radiation through strong spatial confinement of radiation propagating through the optical fiber 100, achieving high localized radiation intensities. The radiation intensity inside the optical fiber 100 may be high, for example due to high received input radiation intensity and/or due to strong spatial confinement of the radiation inside the optical fiber 100. An advantage of hollow core optical fibers is that they can guide radiation having a broader wavelength range than solid-core fibers and, in particular, hollow core optical fibers can guide radiation in both the ultraviolet and infrared ranges.

An advantage of using a hollow core optical fiber 100 may be that the majority of the radiation guided inside the optical fiber 100 is confined to the hollow core 102. Therefore, the majority of the interaction of the radiation inside the optical fiber 100 is with the working medium 126, which is provided inside the hollow core 102 of the optical fiber 100. As a result, the broadening effects of the working medium 126 on the radiation may be increased.

The received input radiation 122 may be electromagnetic radiation. The input radiation 122 may be received as pulsed radiation. For example, the input radiation 122 may comprise ultrafast pulses.

The input radiation 122 may be coherent radiation. The input radiation 122 may be collimated radiation, an advantage of which may be to facilitate and improve the efficiency of coupling the input radiation 122 into the optical fiber 100. The input radiation 122 may comprise a single frequency, or a narrow range of frequencies. The input radiation 122 may be generated by a laser. Similarly, the output radiation 124 may be collimated and/or may be coherent.

The broadband range of the output radiation 124 may be a continuous range, comprising a continuous range of radiation frequencies. The output radiation 124 may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation 124 may comprise for example electromagnetic radiation over a wavelength range of 100 nm-4000 nm. The broadband output radiation 124 frequency range may be for example 400 nm-900 nm, 500 nm-900 nm, or 200 nm-2000 nm. The supercontinuum output radiation 124 may comprise white light.

The input radiation 122 provided by the pulsed pump radiation source 136 may be pulsed. The input radiation 122 may comprise electromagnetic radiation of one or more frequencies between 200 nm and 2 µm. The input radiation 122 may for example comprise electromagnetic radiation with a wavelength of 1.03 µm. The repetition rate of the pulsed radiation 122 may be of an order of magnitude of 1 kHz to 100 MHz. The pulse energies may have an order of magnitude of 0.01 µJ to 100 µJ, for example 0.1 µJ to 100 µJ, or for example 1-10 µJ. A pulse duration for the input radiation 122 may be between 10 fs and 10 ps, for example 300 fs. The average power of input radiation 122 may be between 100 mW to several 100 W. The average power of input radiation 122 may for example be 20-50 W.

The broadband output radiation 124 provided by the radiation source 134 may have an average output power of at least 1 W. The average output power may be at least 5 W. The average output power may be at least 10 W. The broadband output radiation 124 may be pulsed broadband output radiation 124. The broadband output radiation 124 may have a power spectral density in the entire wavelength band of the output radiation of at least 0.01 mW/nm. The power spectral density in the entire wavelength band of the broadband output radiation may be at least 3 mW/nm.

Some embodiments relate to radiation sources of the form of the radiation source 134 shown in FIG. 8 comprising a hollow core optical fiber 100; a working medium 126 disposed within the hollow core; and a pulsed pump radiation source 136 arranged to produce pulsed pump radiation 122 that is received by, and propagates through, the hollow core from an input end 110 to an output end 112. In particular, some embodiments relate to such a radiation source wherein one or more parameters of the pulsed pump radiation 122, the optical fiber 100 and the working medium 126 are configured to allow soliton self-compression of the pulsed pump radiation 122 so as to change a spectrum of the pulsed pump radiation 122 so as to form output radiation 124.

Some broadband radiation sources use arrangements which produce spectral broadening of pulsed pump radiation but wherein parameters of the pulsed pump radiation, the optical fiber and the working medium are configured to allow modulational instability to produce the spectral broadening. There are a number of reasons why modulational instability is used to produce the spectral broadening. First, modulational instability is known to produce broadband radiation having a relatively flat intensity-wavelength distribution, provided a sufficient number of pulses are averaged. Such a broadband radiation source may be referred to as a white light radiation source (due to the relatively flat spectral intensity distribution). Second, modulational instability can be achieved using relatively economical laser sources as the pump radiation source.

On the other hand, in the regime of soliton self-compression an input pulse undergoes compression in the time domain, which is accompanied by an increase in a width of the spectrum. Following soliton self-compression, the compressed pulse undergoes soliton fission, wherein the pulse splits into a plurality of solitons. This soliton fission results in temporal broadening of the radiation pulse and a shifting of the spectrum.

In some embodiments, a length of the optical fiber 100 is such that the output end 112 substantially coincides with a position at which soliton self-compression occurs but before soliton fission starts. This provides a particularly stable broadband radiation source that is relatively smooth and does not have any significant gaps in its spectrum.

In some embodiments, the length of the optical fiber 100 is such that the output end 112 substantially coincides with a position at which a temporal extent of the output radiation 124 is smaller than a first threshold value, or, optionally, the temporal extent of the output radiation 124 is minimal. The first threshold value may be chosen such that a wide enough output radiation spectrum is obtained. In practice the compressed pulse leaving the output end 112 of the fiber 100, is temporally broadened by the second transparent window 132 as a result of bulk material dispersion. Consequently, a duration of the pulses of the output radiation 124 after the second transparent window 132 may be relatively large.

In some embodiments, the length of the optical fiber 100 is such that the output end 112 substantially coincides with a position at which a breadth of the spectrum of the output radiation 124 is larger than a second threshold value, or, optionally, at which the breadth of the spectrum of the output radiation 124 is maximal. The second threshold value may be chosen such that the breadth of the spectrum is large enough to fulfil a bandwidth requirement of a certain application, e.g. a requirement of a metrology sensor.

In some embodiments, the length of the optical fiber 100 is such that the output end 112 substantially coincides with a position at which the spectrum of the output radiation 124 is substantially continuous.

Such radiation sources are advantageous since they allow a stable, broadband output radiation beam 124 to be produced at the output end 112, as now discussed. Such a stable, broadband output radiation beam 124 may be useful for use within a metrology apparatus, for example within a lithographic apparatus.

In a soliton self-compression regime (with a relatively low soliton number) a pulse of radiation can undergo significant temporal compression, which is accompanied by spectral broadening. Eventually, the temporal compression will reach a maximal level (corresponding to a minimum temporal extent of the pulsed radiation) followed by temporal broadening of the radiation (soliton fission). The (higher order) soliton may oscillate between periods of temporal compression and temporal broadening as it propagates along the hollow core optical fiber. Following temporal broadening, other effects can lead to shifting of the spectrum of the radiation. For example, self-steepening (which may accompany and aid the soliton self-compression) can lead to an optical shock which can seed dispersive wave emission. By tuning one or more parameters of the system, a particular, desirable wavelength may be generated. For example, the wavelength may be selected so as to be suitable for interacting with a particular molecule and used in research experiments studying the molecule. Therefore, soliton self-compression is an effective regime for generating from an input pump laser beam having first wavelength, an output radiation beam having a second, shifted wavelength.

It has been realized that during soliton self-compression, before the temporal broadening (and before any dispersive waves are formed), there is a (short-lived) transition period during which the radiation propagating through the hollow-core fiber is broadband radiation (i.e. having a broad, relatively flat spectrum with no significant gaps in the spectral density spectrum). Furthermore, it has been realized that, although this broadband radiation is short lived, by selecting the length of the optical fiber 100 such that the output end 112 substantially coincides with a position at which the soliton self-compression has occurred but before subsequent temporal broadening and shifting of the spectrum, this broadband radiation can be output from the optical fiber 100 so as to provide a particularly stable broadband radiation source 134.

In particular, a particularly stable broadband radiation source 134 can be provided if the length of the optical fiber 100 is such that the output end 112 substantially coincides with a position at which a temporal extent of the radiation is minimal.

Generally, after the soliton self-compression, the breadth of the spectrum of the pulsed radiation may decrease and/or gaps in the spectrum may develop (for example as the soliton evolves and as dispersive waves are emitted). Therefore, a particularly stable and flat broadband radiation source can be provided if the length of the optical fiber 100 is such that the output end 112 substantially coincides with a position at which a breadth of the spectrum of the radiation is maximal. Or, a particularly stable and flat broadband radiation source can be provided if the length of the optical fiber 100 is such that the output end 112 substantially coincides with a position at which the spectrum of the radiation is substantially continuous.

In contrast to noise-seeded modulational instability systems, broadband radiation generated by such soliton self-compression will have substantially no shot-to-shot variations. As a result, advantageously, a stable output spectrum can be generated using a single pulse. In contrast, several pulses would be required to produce some stability in the output beam of a modulational instability system.

It will be appreciated that as the radiation propagates through the hollow core fiber 100 the soliton may oscillate between periods of temporal compression and temporal broadening. In between each period of temporal compression and temporal broadening there may be a local minimum in the temporal extent of the radiation. In principle, the length of the optical fiber 100 may be such that the output end 112 substantially coincides with any such position of minimal temporal extent of the radiation. However, a most stable (for example against pulse to pulse variations) and flattest output spectrum may be provided when the output end 112 coincides with the first position of minimal temporal extent of the radiation.

Some embodiments relate to radiation sources which exploit soliton self-compression and wherein a pulse duration of the input pulsed pump radiation 122 is greater than 50 fs, and, optionally, the pulse duration of the input pulsed pump radiation 122 is smaller or equal to 400 fs. For example, the pulse duration of the input pulsed pump radiation 122 may be greater than 100 fs, for example of the order of 150 fs.

Some embodiments relate to radiation sources which exploit soliton self-compression and wherein a pulse energy of the input pulsed pump radiation is less than 1 μJ, and, optionally, the pulse energy of the input pulsed pump radiation is larger than or equal to 0.1 μJ.

The soliton order N of the input pulsed pump radiation 122 is a convenient parameter that can be used to distinguish conditions under which spectral broadening is dominated by modulational instability and conditions under which spectral broadening is dominated by soliton self-compression. The soliton order N of the input pulsed pump radiation 122 is given by:

$$N = \sqrt{\gamma \frac{P_p \tau^2}{|\beta_2|}} \quad (1)$$

where γ is a nonlinear phase (or nonlinear parameter); $P_p$ is a pump peak power of the input pulsed pump radiation 122; τ is a pump pulse duration of the input pulsed pump radiation 122; and $\beta_2$ is the group-velocity dispersion of the working medium 126.

Spectral broadening is typically dominated by modulational instability when N>>20 whereas spectral broadening is typically dominated by soliton self-compression when N<<20.

Therefore, for arrangements which use soliton self-compression it is desirable to produce input pulsed pump radiation 122 with a low soliton order N. Furthermore, as can be seen from equation (1), the soliton order of the input pulsed pump radiation 122 is proportional to the pulse duration τ of the input pulsed pump radiation 122. Therefore, generally prior art arrangements wherein soliton self-compression dominates, the pulse duration τ of the input pulsed pump radiation 122 is typically reduced to of the order of 30 fs or less. To realize such an arrangement, typically a compressed, high-power femtosecond-fiber laser or Ti:Sapph amplifier is used as the pulsed pump radiation source 136. A Ti:Sapph amplifier can produce pulsed radiation with a pulse duration τ of the order of 30 fs or less. High-power, femtosecond-fiber lasers typically have pulse durations of 300 fs and therefore known soliton self-compression arrangements that use femtosecond-fiber lasers also comprise a system for compressing this pulse duration to, for example, 30 fs. Such a system for compressing the pulse duration may, for example, use self-phase modulation based spectral broadening and phase compression using chirped mirrors or gratings. The laser heads are relatively bulky (a femtosecond-fiber laser head has, for example, dimensions of 60×40×20 cm) and, in most cases, require external controllers and water chillers. In addition, such lasers are relatively cost intensive.

It has been realized that the soliton order of the input pulsed pump radiation can alternatively be reduced by reducing the pulse energy $E_p$ of the input pulsed pump radiation (where $E_p=P_p\tau$). For example, if all other parameters remain constant, by reducing the pulse energy $E_p$ of the input pulsed pump radiation by a factor of α, the same soliton order can be achieved using a pulse duration that is increased by a factor of α. This reduction of the pulse energy is contrary to the teachings of the prior art wherein it is taught to use increased pulse energy. In the prior art, radiation sources using soliton self-compression are typically used for research applications such as, for example atomic or molecular spectroscopy wherein it is desirable to maximize the pulse energy of the radiation source.

An example embodiment is now discussed with reference to FIGS. 9A to 10B.

Figure 9A:
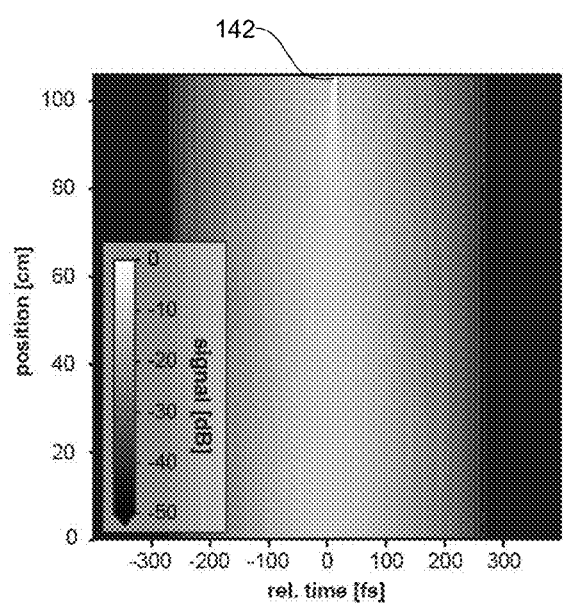
FIGS. 9A and 9B show a simulation of temporal and spectral evolution of a pulse of radiation within the hollow core optical fiber of the radiation source shown in FIG. 8 when a second, output end of the optical fiber coincides with a position at which the temporal extent of radiation is minimal.
Figure 9B:
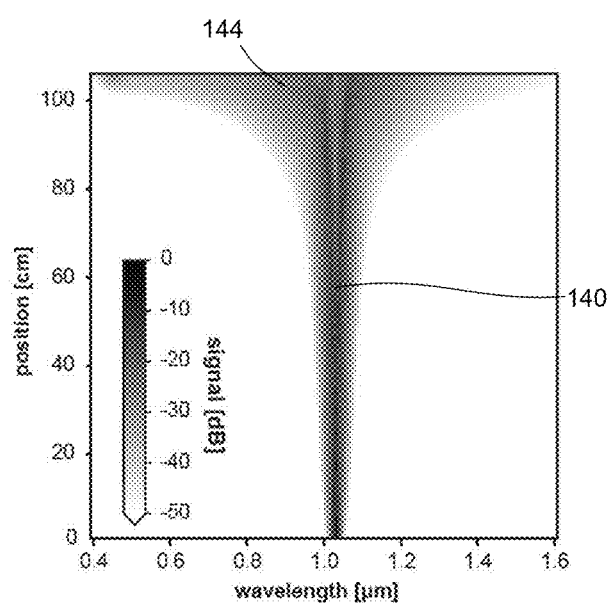

FIGS. 9A and 9B show a simulation of the temporal and spectral evolution of a pulse of radiation within the hollow core optical fiber 100. The hollow core optical fiber 100 has a core diameter of 32.5 μm, which is filled with a working medium 126 of Krypton gas at a pressure of 10 bar. The input pulsed pump radiation 122 has a pump pulse duration of τ of 150 fs, a pulse energy $E_p$ of 0.4 μJ energy and a wavelength of 1030 nm. This pulse energy $E_p$ is approximately one order of magnitude lower than is currently used in modulational instability driven broadband radiation sources. This configuration allows pumping in the anomalous dispersion regime ($\beta_2$=−6.3 fs²/cm at the pump wavelength of 1030 nm). The soliton order of N=17 allows soliton self-compression of the pulsed pump radiation 122 so as to change a spectrum of the pulsed pump radiation so as to form output radiation 124.

In a first portion of the optical fiber 100, the radiation undergoes self-phase modulation 140. This is followed by soliton self-compression 142, a temporal extent of the radiation being minimal at a distance of approximately 110 cm from the first end 112 of the optical fiber 100 (see FIG. 9A). As can be seen in FIG. 9B, this soliton self-compression is accompanied by significant broadening 144 of the spectrum of the radiation. The second end 114 of the optical fiber 100 coincides with the position 142 at which the temporal extent of radiation is minimal.

Figure 9C:
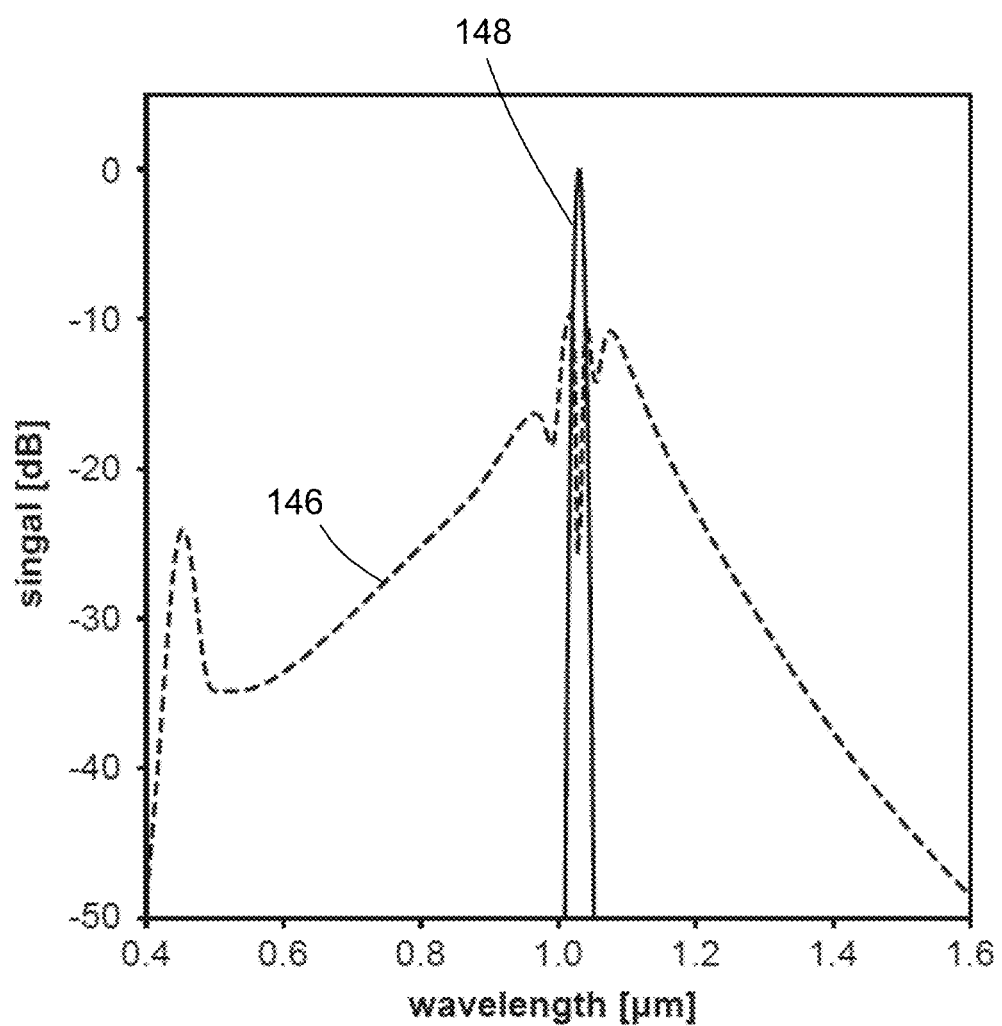
FIG. 9C shows a simulation of the output spectrum of the radiation source with the same parameters as the simulation shown in FIGS. 9A and 9B.

FIG. 9C shows the output spectrum 146 of the radiation source 134. Also shown is the spectrum 148 of the input pulsed pump radiation 122. It can be seen that a flatness of about 10 dB is realized in the 500-900 nm band. Note, that the output spectrum 146 has been computed for a single shot, the smoothness is a result from the stability against small perturbations.

Note that the pulse used in the above example embodiment have a pulse duration of τ of 150 fs, which is significantly larger than typical pulse durations (>30 fs) used for soliton self-compression. Furthermore, such pulses can readily be produced by a new class of lasers that provide pulse durations in between Ti:Sapph amplifiers (30 fs) and high-power fiber lasers (300 fs) and come at a dramatically reduced volume or cost recently. An example of a suitable laser is the laser marketed as Goji by Amplitude Systemes SA, a company incorporated in France.

Figure 10A:
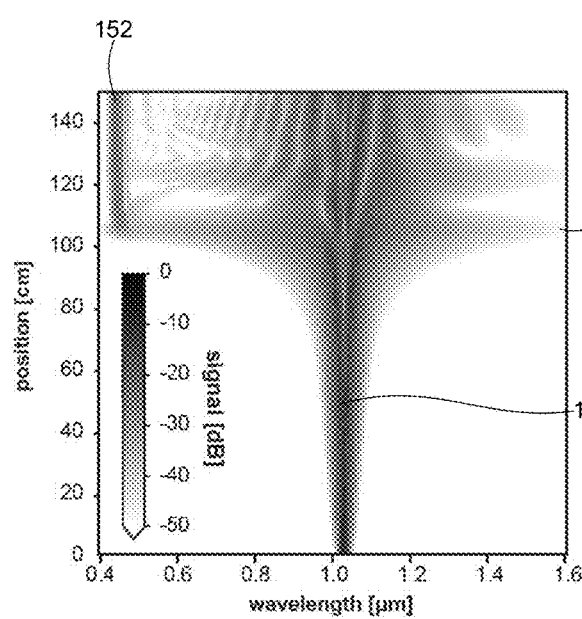
FIG. 10A shows a simulation of spectral evolution of the pulse of radiation within the hollow core optical fiber of the radiation source shown in FIG. 8 that would be experienced if the length of the optical fiber was increased so that the second, output end of the optical fiber does not coincide with the position at which the temporal extent of radiation is minimal.
Figure 10B:
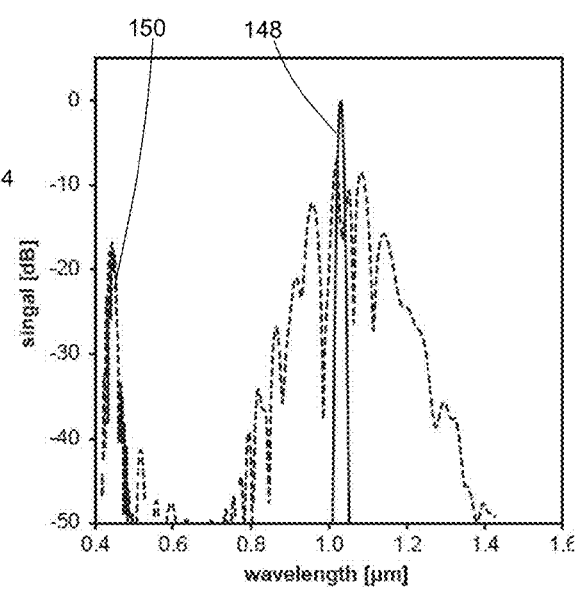
FIG. 10B shows a simulation of the output spectrum of the radiation source with the same parameters as the simulation shown in FIG. 10A.

FIG. 10A shows a simulation of the spectral evolution of a pulse of radiation within the hollow core optical fiber 100 that would be experienced if the length of the optical fiber was increased to 150 cm (i.e. so that the second end 114 of the optical fiber 100 no longer coincides with the position 142 at which the temporal extent of radiation is minimal). FIG. 10B shows the output spectrum 150 of the radiation source 134 with this increased length of optical fiber. Also shown is the spectrum 148 of the input pulsed pump radiation 122.

It can be seen that following the soliton self-compression and associated spectral broadening 144, the spectrum of radiation undergoes a number of changes. For example, a dispersive wave 152 is emitted and the radiation oscillates between periods of spectral compression and spectral broadening.

Furthermore, it can clearly be seen from the output spectrum 150 in FIG. 10B that the flatness of the output spectrum is lost once the second end 114 of the optical fiber 100 no longer coincides with the position 142 at which the temporal extent of radiation is minimal. The spectrum is no longer smooth, having a number of peaks and troughs.

According to some embodiments there is also provided a method of selecting an operating regime of a radiation source 134 of the type shown in FIG. 8. The method may comprise: selecting one or more parameters of one or more selected from: the pulsed pump radiation 122 (for example the a pump pulse duration of τ of and/or the pulse energy $E_r$), the optical fiber 100 (for example the geometry, core diameter, etc.) and/or the working medium 126 (for example the gas composition, pressure, etc.) so as to allow soliton self-compression and such that an output end of the optical fiber 100 substantially coincides with a position at which a temporal extent of the radiation is minimal.

In an initial application of the method, one or more parameters of the optical fiber 100 may be selected. Once the optical fiber 100 has been manufactured, its one or more parameters may be determined, for example by measurement, and can be input as one or more constraints into a second application of the method. This may allow the one or more working parameters of the pulsed pump radiation 122 and/or the working medium 126 to be selected when one or more parameters of the optical fiber 100 are fixed (for example, once the optical fiber has been manufactured).

The radiation source 134 described above may be provided as part of a metrology arrangement for determining a parameter of interest of a structure on a substrate. The structure on the substrate may for example be a lithographic pattern applied to the substrate. The metrology arrangement may further comprise an illumination sub-system configured to illuminate the structure on the substrate. The metrology arrangement may further comprise a detection sub-system configured to detect a portion of radiation scattered and/or reflected by the structure. The detection sub-system may further determine the parameter of interest on the structure from the portion of radiation scattered and/or reflected by the structure. The parameter may for example be overlay, alignment, or levelling data of the structure on the substrate.

The metrology arrangement described above may form part of a metrology apparatus MT. The metrology arrangement described above may form part of an inspection apparatus. The metrology arrangement described above may be included inside a lithographic apparatus LA.

Further embodiments are disclosed in the subsequent numbered clauses:

1. A radiation source comprising:
a hollow core optical fiber comprising a body having a hollow core;
a working medium disposed within the hollow core; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation so as to form output radiation, and
wherein a length of the optical fiber is such that the output end substantially coincides with a position at which a temporal extent of the output radiation is minimal.

2. A radiation source comprising:
a hollow core optical fiber comprising a body having a hollow core;
a working medium disposed within the hollow core; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation so as to form output radiation, and
wherein a length of the optical fiber is such that the output end substantially coincides with a position at which a breadth of the spectrum of the output radiation is maximal.

3. The radiation source of clause 1 or clause 2, wherein the length of the optical fiber is such that the output end substantially coincides with a first local minimum of a temporal extent of the pulsed pump radiation.

4. The radiation source of any of clauses 1-3, wherein a pulse duration of the input pulsed pump radiation is greater than 50 fs, and, optionally, the pulse duration of the input pulsed pump radiation is smaller or equal to 400 fs.

5. The radiation source of any of clauses 1-4, wherein a pulse energy of the input pulsed pump radiation is less than 1 μJ, and, optionally, the pulse energy of the input pulsed pump radiation is larger than or equal to 0.01 μJ.

6. A radiation source comprising:
a hollow core optical fiber comprising a body having a hollow core;
a working medium disposed within the hollow core; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation, and
wherein a pulse duration of the input pulsed pump radiation is greater than 50 fs, and, optionally, the pulse duration of the input pulsed pump radiation is smaller or equal to 400 fs.

7. A radiation source comprising:
a hollow core optical fiber comprising a body having a hollow core;
a working medium disposed within the hollow core; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation, and
wherein a pulse energy of the input pulsed pump radiation is less than 1 μJ, and, optionally, the pulse energy of the input pulsed pump radiation is larger than or equal to 0.01 μJ.

8. The radiation source of any of clauses 1-7, wherein a soliton order of the input pulsed pump radiation is less than 20.

9. The radiation source of any of clauses 1-8, wherein the working medium is configured to produce anomalous dispersion, and, optionally, the working medium is configured to produce anomalous dispersion at least at a wavelength of the pulsed pump radiation.

10. The radiation source of any of clauses 1-9, wherein the hollow core optical fiber comprises a cladding portion surrounding the hollow core, the cladding portion comprising a plurality of anti-resonance elements for guiding radiation through the hollow core.

11. The radiation source of clause 10, wherein the plurality of anti-resonance elements of the cladding portion are disposed in a ring structure around the hollow core.

12. The radiation source of clause 10 or clause 11, wherein the plurality of anti-resonance elements is arranged so that each of the anti-resonance elements is not in contact with any of the other anti-resonance elements.

13. The radiation source of any of clauses 1-12, wherein the working medium comprises a noble gas.

14. The radiation source of any of clauses 1-13, wherein the working medium comprises a molecular gas.

15. A metrology arrangement for determining a parameter of interest of a structure on a substrate, the metrology arrangement comprising:
the radiation source of any of clauses 1-14;
an illumination sub-system for illuminating the structure on the substrate using the broadband output radiation; and
a detection sub-system for detecting a portion of radiation scattered and/or reflected by the structure, and for determining the parameter of interest from said portion of radiation.

16. A lithographic apparatus comprising the metrology arrangement according to clause 15.

17. A method of selecting an operating regime of a radiation source, the radiation source comprising:
a hollow core optical fiber comprising a body having a hollow core;
a working medium disposed within the hollow core; and
a pulsed pump radiation source arranged to produce pulsed pump radiation that is received by, and propagates through, the hollow core from an input end to an output end,
wherein the method comprises:
selecting one or more parameters of one or more selected from: the pulsed pump radiation, the optical fiber and the working medium so as to allow soliton self-compression of the pulsed pump radiation so as to change a spectrum of the pulsed pump radiation so as to form output radiation,
wherein the one or more parameters are selected such that a length of the optical fiber is such that the output end substantially coincides with a position at which:
a temporal extent of the output radiation is smaller than a first threshold value, and/or
a breadth of the spectrum of the output radiation is larger than a second threshold value.

18. The method of clause 17, wherein one or more parameters of the optical fiber are fixed and wherein one or more parameters of the pulsed pump radiation and/or the working medium are selected.

19. The method of clause 17, wherein the one or more parameters are selected such that a length of the optical fiber is such that the output end substantially coincides with a position at which:
a temporal extent of the output radiation is minimal, and/or
a breadth of the spectrum of the output radiation is maximal.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference is made to "metrology apparatus/tool/system" or "inspection apparatus/tool/system", these terms may refer to the same or similar types of tools, apparatuses, or systems. For example, the inspection or metrology apparatus that comprises an embodiment of the invention may be used to determine characteristics of structures on a substrate or on a wafer. For example, the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source comprising:
a hollow core optical fiber comprising a body having a hollow core, the hollow core arranged to have a working medium disposed therein; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation so as to form output radiation, and
wherein a length of the optical fiber is such that the output end substantially coincides with a position at which:
a temporal extent of the output radiation is minimal, and/or
a breadth of the spectrum of the output radiation is maximal.

2. The radiation source of claim 1, wherein the length of the optical fiber is such that the output end substantially coincides with a position at which a temporal extent of the output radiation is minimal.

3. The radiation source of claim 1, wherein the length of the optical fiber is such that the output end substantially coincides with a position at which a breadth of the spectrum of the output radiation is maximal.

4. The radiation source of claim 1, wherein the length of the optical fiber is such that the output end substantially coincides with a first local minimum of a temporal extent of the pulsed pump radiation.

5. The radiation source of claim 1, wherein a pulse duration of the input pulsed pump radiation is greater than 50 fs.

6. The radiation source of claim 1, wherein a pulse energy of the input pulsed pump radiation is less than 1 µJ.

7. The radiation source of claim 1, wherein a soliton order of the input pulsed pump radiation is less than 20.

8. The radiation source of claim 1, wherein the working medium is configured to produce anomalous dispersion.

9. The radiation source of claim 1, wherein the hollow core optical fiber comprises a cladding portion surrounding the hollow core, the cladding portion comprising a plurality of anti-resonance elements configured to guide radiation through the hollow core.

10. A metrology arrangement for determining a parameter of interest of a structure on a substrate, the metrology arrangement comprising:
the radiation source of claim 1;
an illumination sub-system configured to illuminate the structure on the substrate using the output radiation; and
a detection sub-system configured to detect a portion of radiation scattered and/or reflected by the structure, and determine the parameter of interest from the portion of radiation.

11. A radiation source comprising:
a hollow core optical fiber comprising a body having a hollow core, the hollow core arranged to have a working medium disposed therein; and
a pulsed pump radiation source arranged to produce pulsed pump radiation that is received by, and propagates through, the hollow core from an input end to an output end,
wherein one or more parameters of the pulsed pump radiation, the optical fiber and the working medium are configured to allow soliton self-compression of the pulsed pump radiation so as to change a spectrum of the pulsed pump radiation, and
wherein a pulse energy of the input pulsed pump radiation is less than 1 µJ.

12. The radiation source of claim 11, wherein a pulse duration of the input pulsed pump radiation is greater than 50 fs.

13. The radiation source of claim 11, wherein a pulse energy of the input pulsed pump radiation is larger than or equal to 0.1 µJ.

14. The radiation source of claim 11, wherein a soliton order of the input pulsed pump radiation is less than 20.

15. The radiation source of claim 11, wherein the working medium is configured to produce anomalous dispersion.

16. The radiation source of claim 11, wherein the hollow core optical fiber comprises a cladding portion surrounding the hollow core, the cladding portion comprising a plurality of anti-resonance elements configured to guide radiation through the hollow core.

17. The radiation source of claim 16, wherein the plurality of anti-resonance elements is arranged so that each of the anti-resonance elements is not in contact with any of the other anti-resonance elements.

18. The radiation source of claim 11, wherein the working medium comprises a noble gas and/or a molecular gas.

19. A metrology arrangement for determining a parameter of interest of a structure on a substrate, the metrology arrangement comprising:
the radiation source of claim 11;
an illumination sub-system configured to illuminate the structure on the substrate using the output radiation; and
a detection sub-system configured to detect a portion of radiation scattered and/or reflected by the structure, and determine the parameter of interest from the portion of radiation.

20. A method of selecting an operating regime of a radiation source, the radiation source comprising:
a hollow core optical fiber comprising a body having a hollow core, the hollow core arranged to have a working medium disposed therein; and
a pulsed pump radiation source arranged to produce pulsed pump radiation that is received by, and propagates through, the hollow core from an input end to an output end,
wherein the method comprises:
selecting one or more parameters of one or more selected from: the pulsed pump radiation, the optical fiber and the working medium so as to allow soliton self-compression of the pulsed pump radiation so as to change a spectrum of the pulsed pump radiation so as to form output radiation,
wherein the one or more parameters are selected such that a length of the optical fiber is such that the output end substantially coincides with a position at which:
a temporal extent of the output radiation is smaller than a first threshold value, and/or
a breadth of the spectrum of the output radiation is larger than a second threshold value.

* * * * *